(12) United States Patent
Boose et al.

(10) Patent No.: US 7,203,460 B2
(45) Date of Patent: Apr. 10, 2007

(54) AUTOMATED TEST OF RECEIVER SENSITIVITY AND RECEIVER JITTER TOLERANCE OF AN INTEGRATED CIRCUIT

(75) Inventors: William Clay Boose, Howe, TX (US); Vernon D. Davis, Mesquite, TX (US); Peter D. Hanish, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 565 days.

(21) Appl. No.: 10/683,195

(22) Filed: Oct. 10, 2003

(65) Prior Publication Data

US 2005/0079822 A1  Apr. 14, 2005

(51) Int. Cl.
*H04B 17/00* (2006.01)

(52) U.S. Cl. ............... 455/67.11; 455/67.14; 455/66.1; 375/224; 375/226; 375/221; 714/724; 714/716; 714/738; 702/69; 702/119; 398/9; 398/182

(58) Field of Classification Search ............. 455/67.11, 455/67.14; 375/224, 226, 221; 714/724, 714/716, 738; 398/182, 9; 702/69, 119
See application file for complete search history.

(56) References Cited

U.S. PATENT DOCUMENTS

| | | | |
|---|---|---|---|
| 5,793,822 A * | 8/1998 | Anderson et al. ......... 375/371 |
| 6,331,999 B1 * | 12/2001 | Ducaroir et al. ......... 375/226 |
| 6,341,142 B2 * | 1/2002 | Ducaroir et al. ......... 375/219 |
| 6,385,236 B1 * | 5/2002 | Chen ...................... 375/224 |
| 6,625,560 B1 * | 9/2003 | Molla et al. ............ 702/120 |
| 6,661,836 B1 * | 12/2003 | Dalal et al. ............ 375/226 |
| 6,871,311 B2 * | 3/2005 | Watanabe et al. ........ 714/738 |
| 6,996,757 B2 * | 2/2006 | Evans .................... 714/724 |
| 7,007,212 B2 * | 2/2006 | Komatsu et al. ......... 714/724 |
| 2002/0174159 A1 | 11/2002 | Laquai |

OTHER PUBLICATIONS

"HRF-AT4611 Preliminary Data Sheet", Honeywell (Jun. 2002).

* cited by examiner

*Primary Examiner*—Marceau Milord
(74) *Attorney, Agent, or Firm*—W. James Brady; Frederick J. Telecky, Jr.

(57) ABSTRACT

An automated test system (20) for testing a high-speed communications integrated circuit (10), such as a serializer/deserializer, is disclosed. The system (20) is able to test the parameters of receiver jitter tolerance and receiver sensitivity in a loopback connection arrangement, in which serial output terminals (SERTX) of the integrated circuit (10) are connected to serial input terminals (SERRX) of the integrated circuit (10). An attenuator (26), which in the disclosed embodiment includes programmable attenuators (30P, 30N) and a fixed attenuator (32), one of which is selected, is disposed in the loopback path. A deterministic jitter injector (28) is also in the loopback path, and may be implemented by way of variable length trace blocks (35P, 35N) on the test board (30). In this way, the serial output signals generated by the integrated circuit (10) are modified by the attenuator (26) and deterministic jitter injector (28) so that the signal as received at the serial input terminals (SERRX) can be at the specification limits of the circuit (10).

22 Claims, 5 Drawing Sheets

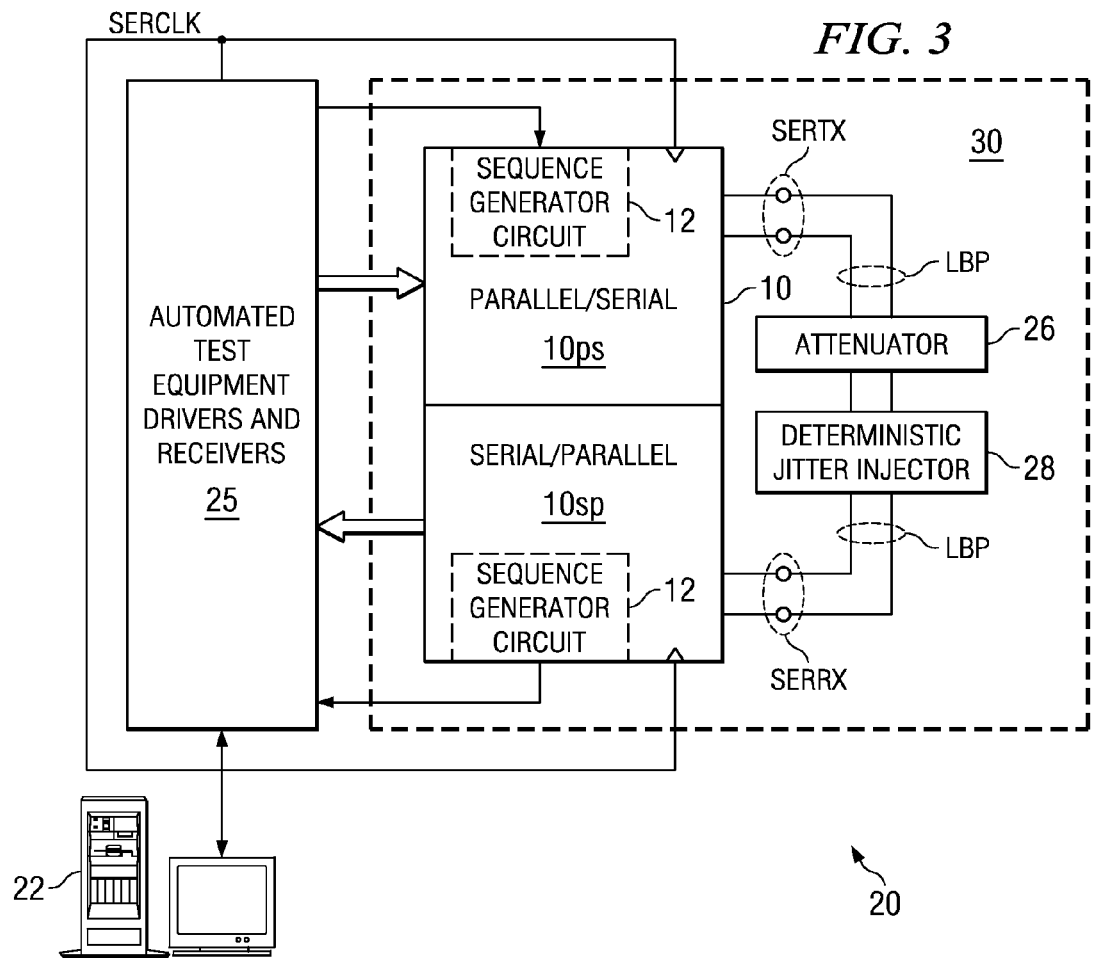

AUTOMATED TEST OF RECEIVER SENSITIVITY AND RECEIVER JITTER TOLERANCE OF AN INTEGRATED CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit testing, and is more specifically directed to the testing of high speed data receiver and transceiver circuits.

Each modern integrated circuit device is typically subjected to electrical testing at least once during the process of its manufacture. In many cases, integrated circuits are functionally tested when in wafer form, to avoid the cost of packaging an integrated circuit device that is not functional or otherwise cannot meet its specified requirements. Packaged integrated circuits are also typically functionally tested in the manufacturing flow, to ensure that the devices not only function but actually meet the speed and power requirements desired by the customer and guaranteed by the manufacturer. Conventional manufacturing testing is often referred to as "100%" testing, in the case where each manufactured device is itself tested prior to shipment. Testing of random samples of previously tested devices is also often performed to ensure the integrity of the test flow and the quality of the manufactured devices.

The testing of integrated circuits that are intended to communicate signals at extremely high frequencies is an historically difficult problem. Typically, automated test equipment is constructed from circuitry that has significantly lower performance than the state-of-the-art circuits that are to be tested by that equipment. In other words, the requirements of the device under test are often more precise and stringent than can be provided by the test equipment that is guaranteeing those requirements. In addition, the test socket and other peripheral connectors and circuitry that interface with each device being tested typically present a different noise environment (often a noisier environment) than the device may face in its end use. Accordingly, the test results of modern automated test equipment may be in error, causing both false failed devices (i.e., devices that in fact meet the specifications but fail the test), and also false passed devices (i.e., devices that do not in fact meet the specifications but pass the test).

Complicating this problem is the extremely high cost of integrated circuit testing. The cost of test equipment having even moderate performance characteristics is extremely high, with modern testers often costing as much as $1 million or more each. Today's modern integrated circuit devices are also very complex, with many devices having hundreds of thousands of transistors and logic gates, each of which require some sort of electrical test to ensure complete functionality. This complexity in turn increases (in some cases, geometrically) the time required to functionally test a device, which of course also increases the test cost. In short, the testing trends for modern integrated circuits generally involves increasingly expensive testers for increasingly longer test times per device.

A particularly difficult test problem is the testing of high-frequency data receiver circuits in modern integrated circuits. Some modern integrated circuits, such as serial/deserializer ("SerDes") devices are designed and specified to transmit and receive serial data at data rates well above 1 gigabit per second ("Gbps"). Examples of modern SerDes devices include the TLK1501, TLK3114, and TLK2201 series of serial gigabit transceiver devices available from Texas Instruments Incorporated. In order to test the functionality of these devices, it is therefore necessary to generate and apply test data at these high rates to the input terminals of the devices under test. For the reasons mentioned above, this test requirement can be quite costly.

Happily, these SerDes devices not only include receiver circuitry that is to operate at these high data rates, but also include high data rate transmitter circuitry. Accordingly, a conventional way to test the transmit and receive functionality of a SerDes device is to operate the device so that it transmits data to itself, in a so-called "loopback" test arrangement.

FIG. 1 illustrates such a conventional loopback test arrangement for SerDes device 10. SerDes device 10 includes, among other circuit functions, parallel-to-serial converter 10$ps$, which receives parallel data signals at one set of terminals and generates a corresponding serial datastream at a pair of output terminals; as such, parallel-to-serial converter 10$ps$ serves as a serial transmitter in SerDes device 10. Typically, for high performance SerDes devices, the serial datastream is communicated by a differential signal, which permits smaller voltage swings of the signal and thus increases the serial data rate. The serial data rate is controlled by a clock signal applied to a clock terminal of parallel-to-serial converter 10$ps$. Conversely, SerDes device 10 includes serial-to-parallel converter 10$sp$, which receives a serial datastream at one pair of terminals and generates corresponding parallel data signals at another set of terminals; as such, serial-to-parallel converter 10$sp$ serves as a serial receiver in SerDes device 10. The data rate at which serial-to-parallel converter 10$sp$ receives and converts the incoming serial data is controlled by a clock signal received at its clock terminal.

In the conventional automated test example shown in FIG. 1, automated test equipment ("ATE") drivers and receivers 5 are in communication with SerDes device 10, by way of a conventional socket or handler (not shown). ATE drivers and receivers 5 generate the parallel data applied to SerDes device 10, and receive parallel data from SerDes device 10, as shown in FIG. 1. In this conventional internal loopback arrangement, the serial output terminals of parallel-to-serial converter 10$ps$ are connected directly to the serial input terminals of serial-to-parallel converter 10$sp$ by way of loopback conductors LBP. For extremely high frequency communications, for example in the Gbps range, loopback conductors LBP have conventionally been kept as short as possible, and formed according to printed circuit board technology well-suited to GHz frequencies.

As shown in FIG. 1, the clock terminals of each of parallel-to-serial converter 10$ps$ and serial-to-parallel converter 10$sp$ are driven by a clock signal from ATE drivers and receivers 5. SerDes device 10 can thus be tested in an automated manner by ATE drivers and receivers 5 applying parallel data signals of a known pattern to parallel-to-serial converter 10$ps$, and by ATE drivers and receivers 5 comparing that known pattern to the parallel data signals received from serial-to-parallel converter 10$sp$. Alternatively, SerDes device 10 may include internal sequence generator circuits 12 in each of parallel-to-serial converter 10ps and serial-to-parallel converter 10sp In a test mode enabled by a signal from ATE drivers and receivers 5, sequence generator circuit 12 in parallel-to-serial converter 10ps generates a known pattern that is then serially transmitted over loopback conductors LBP, and sequence generator circuit 12 in serial-to-parallel converter 10sp generates that pattern for comparison with the serial data received from loopback conductors LBP, thus testing the transmit and receive functions of SerDes device 10.

According to this conventional loopback arrangement, using either an externally generated or an internally generated data pattern, the functionality of SerDes device 10 can be confirmed using automated test equipment. This functionality can include a test of the maximum data rate, assuming that ATE drivers and receivers 5 can generate the serial clock at the necessary frequency. For example, a high data rate clock of 156.25 MHz applied to a conventional SerDes device having a by-four output (i.e., four differential pairs) of 3.125 Gbps can create a 10 Gbps payload.

However, the signals received at the terminals of serial-to-parallel converter 10sp, according to conventional automated test equipment techniques such as shown in FIG. 1, are typically "best case" signals, considering that automated test equipment sockets and test boards are designed and manufactured for maximum signal precision and fidelity. But typical receiver input specifications require devices such as SerDes device 10 to operate accurately with signals at relatively small signal levels, and with signals with varying transition times relative to a synchronizing clock. FIGS. 2a and 2b illustrate these conventional parameters by way of exemplary differential signals.

FIG. 2a illustrates full level differential signal 16 having zero jitter, by way of reference. For example, in conventional transceiver devices, the full differential level FULL may be on the order of 1 volt or larger. The zero jitter indication refers to the crossover point from one differential level to the other occurring at a nominal point, consistent from cycle to cycle. FIG. 2b, on the other hand, illustrates signal 18 that is at a lower, minimum, differential level MIN, which is at a significantly lower differential voltage swing than that of full level signal 16. In modern transceiver circuits, this minimum level MIN may be specified to be as low as on the order of 200 mV, requiring SerDes device 10 to accurately detect a differential signal of that amplitude. The minimum specified level MIN is typically referred to as "receiver sensitivity".

Signal 18, as illustrated in FIG. 2b, also exhibits a certain amount of jitter, in that the timing point of its crossover from one level to another may vary from the nominal, zero jitter, point as shown for signal 16 in FIG. 2a. This jitter is typically expressed as a fraction or percentage of the cycle time, with a typical jitter specification for devices such as SerDes device 10 being on the order of 20%. This parameter is typically referred to as "receiver jitter tolerance". A comparison of signal 18 in FIG. 2b to that of signal 16 of FIG. 2a shows that the "eye" region of signal 18, which as known in the art is exhibited as the stable area between transitions, is greatly reduced from that of signal 16. Signal 18 more closely approximates the signal conditions likely to be encountered by SerDes device 10 in its system application, and also more closely approximates the worst case specification limits under which SerDes device 10 is guaranteed to operate.

For purposes of this description, the term "jitter" will refer to deterministic jitter, which is the delay or jitter involved in the timing of differential signal bit-to-bit crossover points related to conductor path length variations and the like. In actual systems, other noise sources also insert jitter known as "random" jitter. As known in the test art, however, the tolerance of the receiver to total jitter, including deterministic and random jitter, is tested through the use of known deterministic jitter.

From a comparison of FIGS. 2a and 2b, it is apparent that the excellent signal quality provided by the loopback conductors LBP in the automated test setup of FIG. 1 provides a strong and stable signal to the receive circuitry of serial-to-parallel converter 10sp. From a test standpoint, however, this conventional setup obviously does not test for the parameters of receiver sensitivity and receiver jitter tolerance. Accordingly, following conventional automated loopback techniques, 100% manufacturing testing of these parameters is not practicable. However, modern customers of high-speed communications components such as SerDes devices rightfully demand 100% testing of critical parameters, including receiver jitter tolerance and receiver sensitivity.

While one could theoretically program the output levels from the transmitter to be produced at lower voltage swings, and while one could vary the timing of the differential crossover points to simulate jitter, this type of iterative testing would significantly add to device test times, and thus significantly increase test costs. In addition, the variation of output levels and bit timings also presumes accuracy in the transmitter portion of SerDes device 10, which may not be an accurate assumption given that this transmitter side is also being tested.

By way of further background, U.S. Patent Application Publication 2002/0174159 describes a filter for injecting data dependent jitter and level noise into a data signal into a loopback path or stimulus path, in the automated testing of an integrated circuit. The disclosed filter includes resistive, inductive, and capacitive components, inserted between nodes in a transmission line.

By way of still further background, the use of circuit boards with traces of different lengths in high-frequency laboratory bench test setups is known. For example, one type of these boards includes parallel pairs of traces of different lengths, to which connection can be made in characterizing the performance of driver and receiver circuits.

BRIEF SUMMARY OF THE INVENTION

It is an object of this invention to provide an apparatus and method for inserting both jitter and attenuation into the loopback path of a high frequency signal, in an automated test equipment environment.

It is a further object of this invention to provide such an apparatus and method that permits a "Go/No-Go" test of receiver jitter tolerance and receiver sensitivity, at full operating speed.

It is a further object of this invention to provide such an apparatus and method that may be implemented in a low-cost yet programmable manner in automated test equipment.

It is a further object of this invention to provide such an apparatus and method in which the desired jitter and attenuation can be precisely set and remain repeatable at high frequencies.

Other objects and advantages of this invention will be apparent to those of ordinary skill in the art having reference to the following specification together with its drawings.

The present invention may be implemented by inserting a signal attenuator and a deterministic jitter injector into a loopback path in automated test equipment for high-speed communications integrated circuit devices. The signal attenuator permits testing of receiver sensitivity, and is implemented by way of either a fixed network of impedances, preferably resistors, or alternatively by way of a programmable attenuation device; selection between the fixed network and the programmable device is effected by connections made at the test board. The deterministic jitter injector permits testing of receiver jitter tolerance, and is implemented by selecting of one of a plurality of available trace lengths in the loopback path on the test board.

BRIEF DESCRIPTION OF THE SEVERAL VIEWS OF THE DRAWING

FIG. 3 is an electrical diagram, in block and schematic form, of an automated test apparatus, including a device under test, according to the preferred embodiment of the invention.

FIGS. 5a, and 5c through 5g are each a plan view of a portion of a test board for the automated test apparatus of FIG. 3, configured for a particular loopback path length, according to the preferred embodiment of the invention.

DETAILED DESCRIPTION OF THE INVENTION

Figure 1:
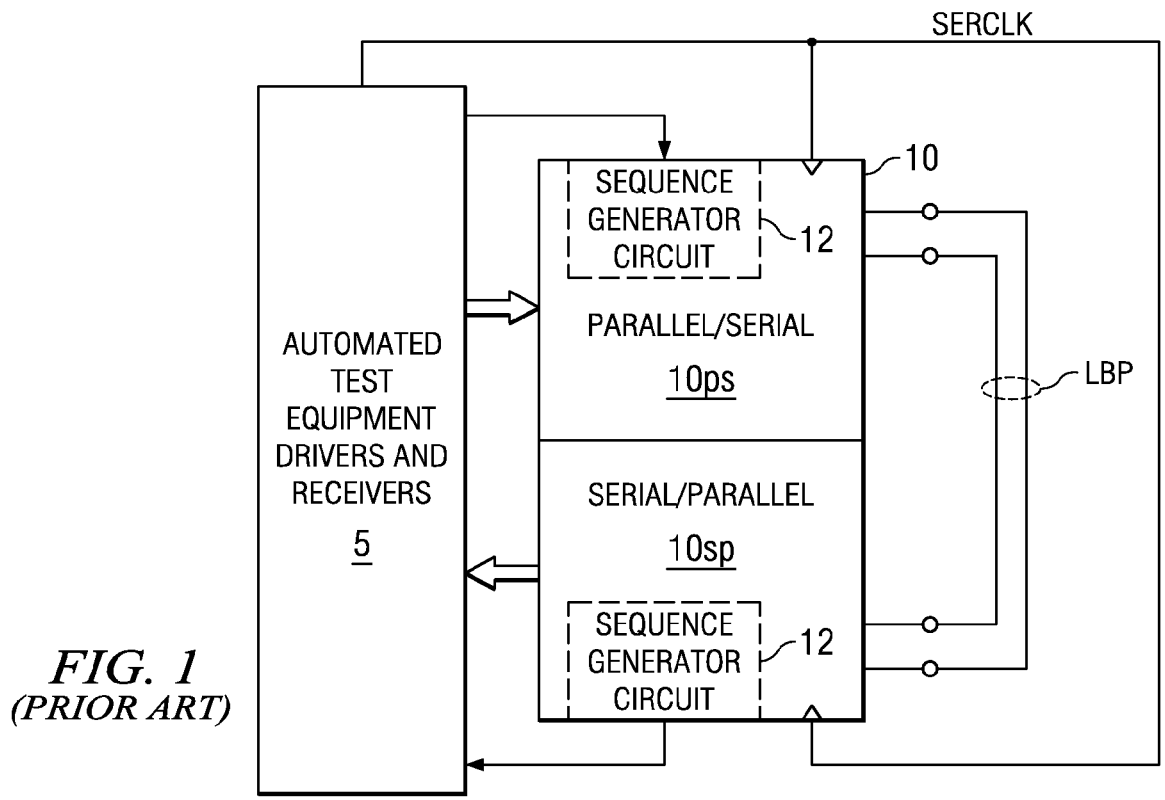
FIG. 1 is an electrical diagram, in block form, of conventional loopback automated testing of high-speed transceiver integrated circuit devices, such as a serializer/deserializer.
Figure 2A:
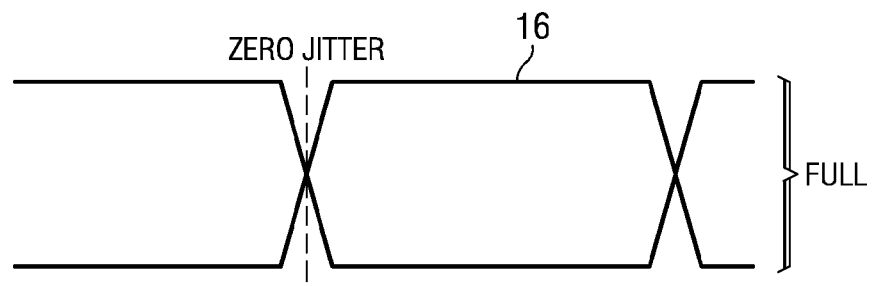
FIGS. 2a and 2b are timing diagrams illustrating the respective signal shapes of a full level, best-case, differential signal and a minimum level, jittered, differential signal.
Figure 2B:
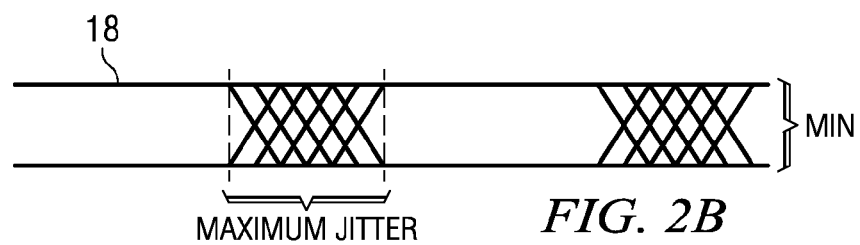

The present invention will be described in connection with its preferred embodiment, namely as implemented into automated test equipment for high-speed communications integrated circuits, such as a serializer/deserializer transceiver device, considering that this invention is especially beneficial when implemented into such an environment. However, it is contemplated that this invention may also provide benefits when used in the automated testing of other types of integrated circuit devices, and also in the automated testing of other electronic components. Accordingly, it is to be understood that the following description is provided by way of example only, and is not intended to limit the true scope of this invention as claimed.

Referring now to FIG. 3, the electrical construction of an automated test apparatus 20, for testing SerDes device 10 according to the preferred embodiment of the invention, will now be described. Automated test apparatus 20 includes ATE drivers and receivers 25, which drive and receive signals to and from one or more devices under test (DUTs). In this example, the DUT is SerDes device 10, which is a high-speed serializer/deserializer integrated circuit such as a member of the TLK1501, TLK3114, and TLK2201 series of serial gigabit transceiver devices available from Texas Instruments Incorporated. Of course, other transceiver and other integrated circuit devices may alternatively be tested by automated test apparatus 20 according to this invention.

ATE drivers and receivers 25 are in communication with control computer 22 that is connected directly to ATE drivers and receivers 25, or indirectly thereto via a computer network (not shown), and which manages and defines the tests to be performed upon SerDes device 10 in this example, and which monitors the results of those tests. According to this embodiment of the invention, such a control computer or network may be constructed and operated in the conventional manner, of course depending upon the particular DUT and the desired tests.

ATE drivers and receivers 25 communicate with SerDes device 10, in this embodiment of the invention, by way of signals communicated along test board 30. SerDes device 10 is connected to test board 30 in the conventional manner, for example by way of a socket that receives and retains packaged SerDes device 10, by way of a handler interface that contacts terminals of SerDes device 10 to permit automated testing of many such devices in sequence, by way of a probe card or other interface for testing SerDes device 10 in wafer form, and in other ways known in the art. In addition, it is contemplated that multiple ones of SerDes device 10 may simultaneously be connected to test board 30, for testing in parallel, as known in the art; such parallel testing of course greatly increases the utilization of automated test apparatus 20, and greatly reduces the test cost per device. As shown in FIG. 3, ATE drivers and receivers 25 includes drivers for presenting parallel data signals to parallel-to-serial converter 10ps in SerDes device 10, and receivers for receiving parallel data signals from serial-to-parallel converter 10sp in SerDes device 10. In addition, ATE drivers and receivers 25 are connected to the clock terminals of each of parallel-to-serial converter 10ps and serial-to-parallel converter 10sp in SerDes device 10, for applying serial clock signal SERCLK to SerDes device 10 during testing.

As shown in FIG. 3, differential serial output terminals SERTX of parallel-to-serial converter 10ps are coupled to differential serial input terminals SERRX of serial-to-parallel converter 10sp, in loopback fashion via a loopback path LBP. According to this embodiment of the invention, attenuator 26 and deterministic jitter injector 28 are inserted into this loopback path. Attenuator 26 applies a selectable level of attenuation to the differential signal driven from terminals SERTX, which as described below permits testing of receiver sensitivity. Deterministic jitter injector 28 insert a selectable amount of jitter into the differential signal driven from terminals SERTX, which as described below permits testing of receiver jitter tolerance. According to this embodiment of the invention, therefore, attenuator 26 and deterministic jitter injector 28 enable the loopback automated test arrangement of FIG. 3 to not only test the functionality of SerDes device 10 for full level, minimum jitter, signals, but also test the receiver jitter tolerance and receiver sensitivity of SerDes device 10, under such frequency and voltage conditions as desired. The particular construction of attenuator 26 and deterministic jitter injector 28 according to the preferred embodiment of this invention will be described in detail below.

In its general operation, ATE drivers and receivers 25 apply the appropriate signals to SerDes device 10 to cause the transmission and receipt of known data signals. For example, ATE drivers and receivers 25 can apply parallel data to parallel-to-serial converter 10ps, in combination with serial clock SERCLK, in response to which parallel-to-serial converter 10ps will drive a differential serial datastream at its terminals SERTX. In the loopback arrangement of FIG. 3 according to the preferred embodiment of this invention, these differential signals are attenuated by attenuator 26 and have jitter injected thereinto by deterministic jitter injector 28, and are then received at terminals SERRX of serial-to-parallel converter 10sp, and converted to parallel data signals at the rate established by serial clock SERCLK from ATE drivers and receivers 25. The parallel data are then received by ATE drivers and receiver 25, and compared against that applied to parallel-to-serial converter 10ps, to determine whether SerDes device 10 functioned properly in its transmission and receipt of this known data.

Optionally, if SerDes device 10 includes sequence generation circuits 12 for generating test sequences for testing the transmit and receive link, ATE drivers and receivers 25 apply the appropriate test control signals to SerDes device 10 in combination with serial clock SERCLK, causing parallel-to-serial converter 10ps to issue a serial datastream corresponding to the sequence generated by its sequence generation circuit 12, and causing serial-to-parallel converter 10sp to match the received serial datastream to the same sequence as generated by its sequence generation circuit 12. In this case, serial-to-parallel converter 10sp issues signals to ATE drivers and receivers 25 that indicate whether the received data matched that transmitted from parallel-to-serial converter 10ps (e.g., in the sequence generation circuits 12 are used).

In any case, a "Go/No-Go" test of SerDes device 10 is performed according to this embodiment of the invention, in a manner that tests the receiver sensitivity and receiver jitter tolerance of its serial-to-parallel converter 10sp. Compliance with these important specification parameters can then be assured for each and every SerDes device 10, as 100% testing of this functionality can be readily performed using automated test equipment.

Figure 4:
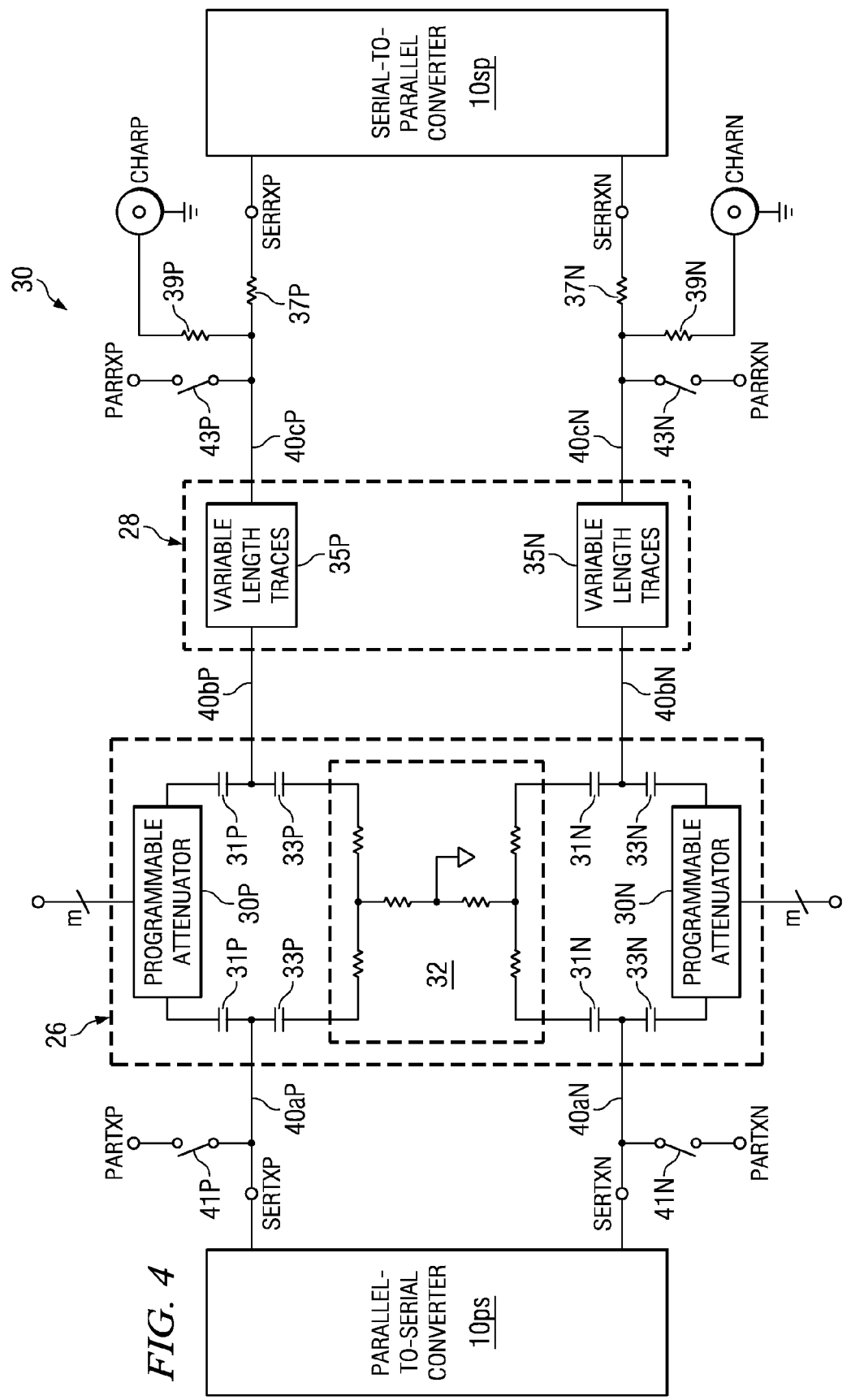
FIG. 4 is an electrical diagram, in block and schematic form, illustrating the construction of the loopback path in the automated test apparatus of FIG. 3, according to the preferred embodiment of the invention.

Referring now to FIG. 4, the electrical configuration of the loopback path on test board 30 in the automated testing of SerDes device 10 according to the preferred embodiment of the invention will now be described in detail. As shown in FIG. 4, terminals SERTXP and SERTXN (which together comprise terminals SERTX, shown in FIG. 3) of parallel-to-serial converter 10ps are connected to attenuator 26 by way of conductors 40aP, 40aN, respectively. Attenuator 26 is connected to deterministic jitter injector 28 by conductors 40bP, 40bN, and deterministic jitter injector 28 is connected, by conductors 40cP, 40cN, to respective terminals SERRXP, SERRXN (which together comprise terminals SERRX of FIG. 3) of serial-to-parallel converter 10sp. While not explicitly shown in FIG. 4, each of the conductors 40, connectors (not shown), and other components in the loopback path are preferably selected and constructed according to conventional standard practices for GHz frequency signal communication.

According to this preferred embodiment of the invention, as shown in FIG. 4, attenuator 26 is constructed to have a programmable portion and also a fixed portion. The programmable portion of attenuator 26 is implemented by way of a pair of digitally programmable attenuators 30P, 30N, each having inputs by way of which the desired attenuation level may be selected, for example by control inputs from ATE drivers and receivers 25. Programmable attenuators 30P, 30N are preferably implemented by way of conventional integrated circuits providing such attenuation, such as the HRF-AT4611 programmable RF attenuator available from Honeywell. Programmable attenuators 30P, 30N thus respond to a digital control word to select and insert a desired attenuation impedance in line with conductors 40 in the loopback path LBP.

Also according to the preferred embodiment of the invention, fixed attenuator 32 is provided within attenuator 26. Fixed attenuator 32, in this example, is a "T" network of resistors biased to ground potential. The resistors within fixed attenuator 32 are preferably conventional RF resistors, having resistance values in the "T" network for a desired level of attenuation of the differential serial signals generated by serial-to-parallel converter 10ps. It is contemplated that those skilled in the art having reference to this specification will be readily able to select the component values of the resistors in fixed attenuator 32 for a desired level of attenuation.

Selection of a fixed or programmable attenuation mode in attenuator 26 is preferably effected by installing coupling capacitors as desired into test board 30. In the example of FIG. 4, programmable attenuation is selected by installing coupling capacitor pairs 31P, 31N rather than coupling capacitor pairs 33P, 33N. In this example, each of the capacitors in pairs 31P, 31N are small RF capacitors, for example having a value of on the order of 0.01 µF. Coupling capacitor pair 31P capacitively couples programmable attenuator 30P to conductors 40aP, 40bP, and coupling capacitor pair 31N couples programmable attenuator 30N to conductors 40aN, 40bN. The capacitive coupling provided by capacitor pairs 31P, 31N blocks DC levels at terminals SERTXP, SERTXN from being passed along the loopback path, while also of course inserting programmable attenuators 30P, 30N into the loopback path.

Conversely, selection of fixed attenuator 32 is effected by installing coupling capacitor pairs 33P, 33N rather than coupling capacitor pairs 31P, 31N. Similarly, each of the capacitors in pairs 33P, 33N are small RF capacitors, for example having a value of on the order of 0.01 µF. Capacitor pair 33P capacitively couples one side of the "T" network of fixed attenuator 32 to conductors 40aP, 40bP, while capacitor pair 33N capacitively couples the other side of the "T" network of fixed attenuator 32 to conductors 40aN, 40bN.

In this manner, the level of attenuation provided by attenuator 26 in the loopback path can be easily determined and selected. For example, programmable attenuators 30P, 32P is initially inserted into the loopback path by installing coupling capacitor pairs 31P, 31N. This permits the characterization of the test arrangement for a given type of SerDes device 10. The attenuation of programmable attenuators 30P, 30N may be varied, for example under the control of ATE drivers and receivers 25, both separately and in combination with varying degrees of deterministic jitter inserted by deterministic jitter injector 28 (as described below), to achieve the desired signal characteristics at receiver terminals SERRXP, SERRXN for a given type of SerDes device 10. Once the appropriate level of attenuation is determined, capacitor pairs 31P, 31N may be removed, and capacitor pairs 33P, 33N installed, along with resistors in fixed attenuator 32 having values corresponding to the characterized desired attenuation level determined from programmable attenuators 30: Test board 30 is then ready for 100% manufacturing testing, using the attenuation provided by fixed attenuator 32.

It is contemplated that the characterization of the desired attenuation provided by programmable attenuators 30P, 30N may be sufficiently accurate that additional instances of test board 30 can be constructed only with fixed attenuator 32. Alternatively, it may be required that each test board 30 must itself be characterized relative to the appropriate attenuation to be provided, because of variations in the conductor traces along test board 30 and other subtle factors that have an effect at extremely high frequencies, in which case each instance of test board 30 would include both programmable attenuators 30P, 30N and also fixed attenuator 32.

As shown in FIG. 4, deterministic jitter inserter 28 in this preferred embodiment of the invention is implemented by a pair of variable length trace blocks 35P, 35N, one inserted in each of the differential loopback paths. In this example, variable length trace block 35P is connected between conductors 40bP and 40cP, while variable length trace block 35N is connected between conductors 40bN and 40cN Referring now to FIGS. 5a through 5g, the construction of variable length trace block 35P will be described, by way of example and according to this preferred embodiment of the invention, it being understood that variable length trace block 35N will be similarly constructed, to maintain balance of both ends of the differential signal.

FIG. 5a illustrates this construction of variable length trace block 35P, in plan view. According to the preferred embodiment of this invention, variable length trace block is constructed as a set of fixed length traces 50, 52 that can be individually inserted into the path between conductor 40bP and conductor 40cP. In this example, traces 50a, 50b are each six inches (15.24 cm) in length, and are 8 mil (0.2032 mm) in width. Traces 52, 52b are each three inches (7.62 cm) in length, and also 8 mil (0.2032 mm) in width. Each of traces 50, 52 are associated with a pair of connection pads 54, 56, to which electrical connection can be made by way of zero-ohm jumpers 60, and by way of which the path length between conductor 40bP and conductor 40cP can vary from three inches to eighteen inches, as will be described below.

Figure 5B:
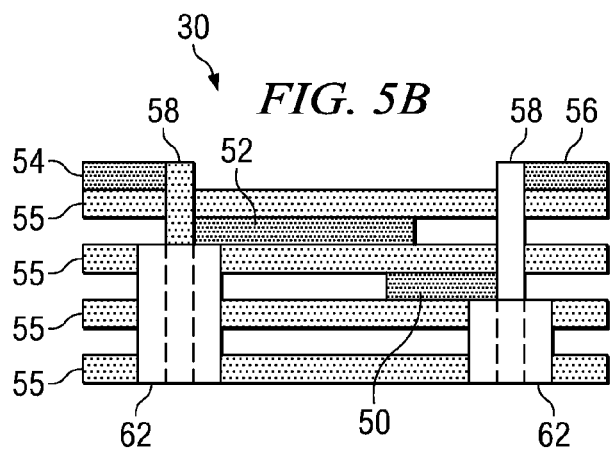
FIG. 5b is a cross-sectional view illustrating the construction of the portion of the test board illustrated in FIGS. 5a and 5c through 5g, according to the preferred embodiment of the invention.

FIG. 5b illustrates, in cross-sectional view, the construction of a portion of test board 30 at the location of variable length trace block 35P, according to the preferred embodiment of the invention in which the signals communicated through variable length trace block 35P are at frequencies in the GHz range. Test board 30 in this example is a multilayer circuit board, including insulating layers 55 for isolating conductors in different layers from one another. As shown in FIG. 5b, connection pads 54, 56 are in a top surface layer of test board 30, and connect to underlying traces 50, 52 by way of via connectors 58. In this example, three-inch traces 52 are disposed in a separate layer from six-inch traces 50, for ease of layout. Also in this example, considering the GHz signal frequencies communicated through variable length trace block 35P, the portions of test board 30 underlying via connectors 58 are drilled out so that "stubs" of via connectors 58 do not extend beyond the traces 50, 52 to which they are connected. Elimination of these stubs maintains signal integrity, as known in the high-frequency signal communication art.

In the example of FIG. 5a, zero-ohm conductors 60a, 60b are shown in place to define a relatively short three-inch path between conductors 40bP, 40cP. Zero-ohm conductors 60a, 60b (also referred to as zero-ohm "resistors") are of the conventional type for GHz signal communications, examples of which are the well-known 0201 type resistors. Zero-ohm conductor 60a connects conductor 40bP to trace 52a, by connecting pad 54a to pad 54b; the other end of trace 52a is connected to conductor 40cP by zero-ohm conductor 60b, which connects pad 56d to pad 56a. Referring back to FIG. 4, variable length trace block 35N will be similarly configured, to maintain signal balance.

FIGS. 5c through 5g illustrate examples of the available configurations of variable length trace block 35P in implementing the available trace lengths; of course, these implementations are not necessarily the only way in which a given path length can be inserted. Again, in each of the cases illustrated in FIGS. 5c through 5g, variable length trace block 35N will be similarly configured, to ensure fidelity of the differential signal.

Figure 5C:
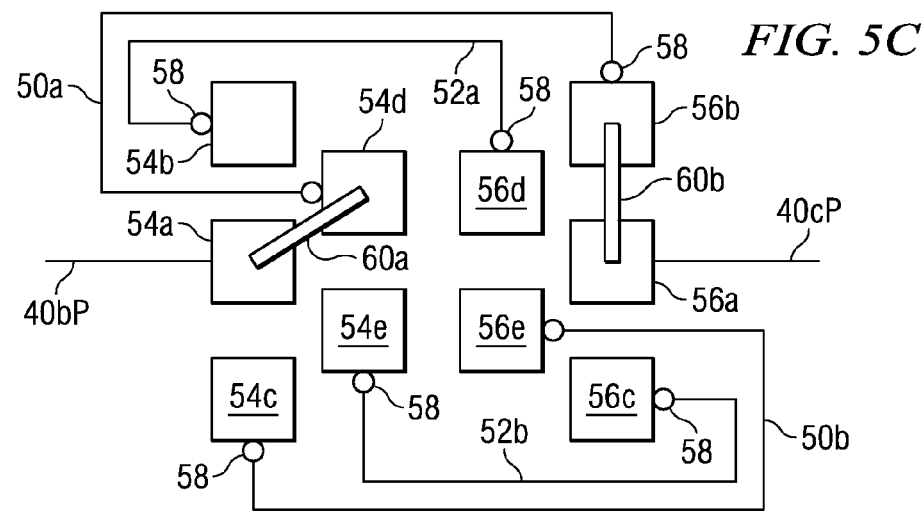
Figure 5D:
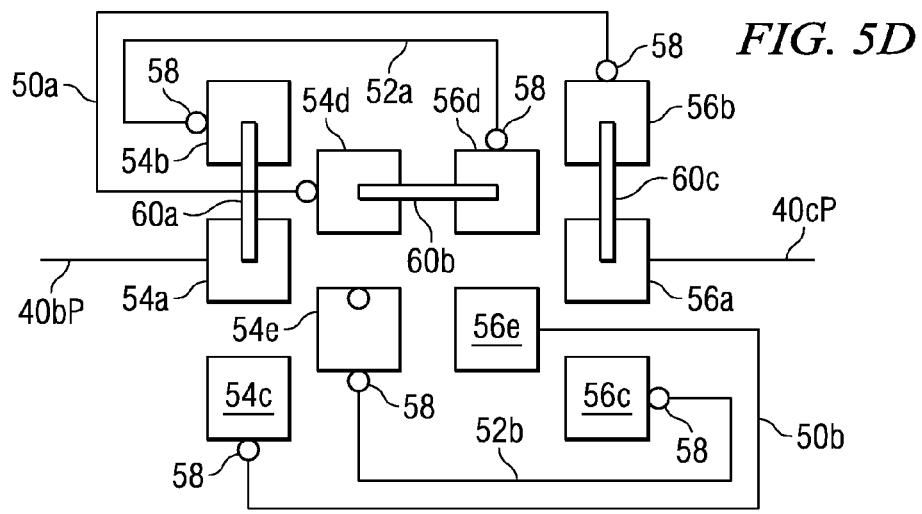
Figure 5E:
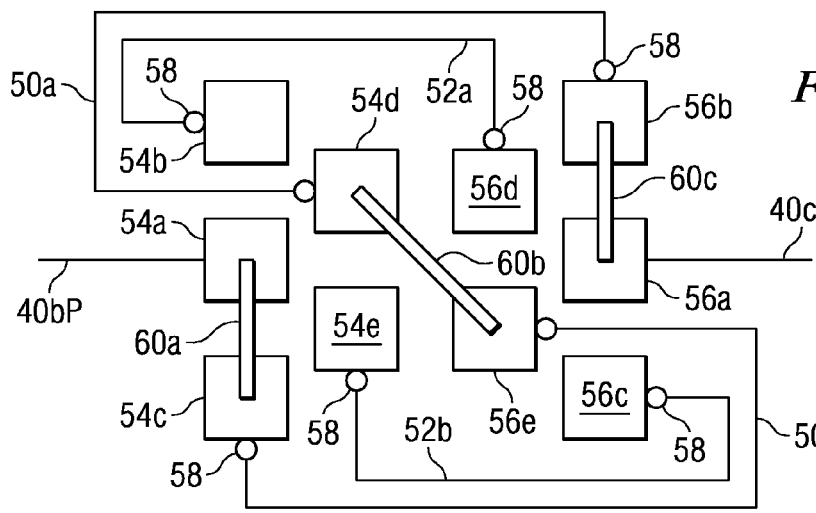
Figure 5F:
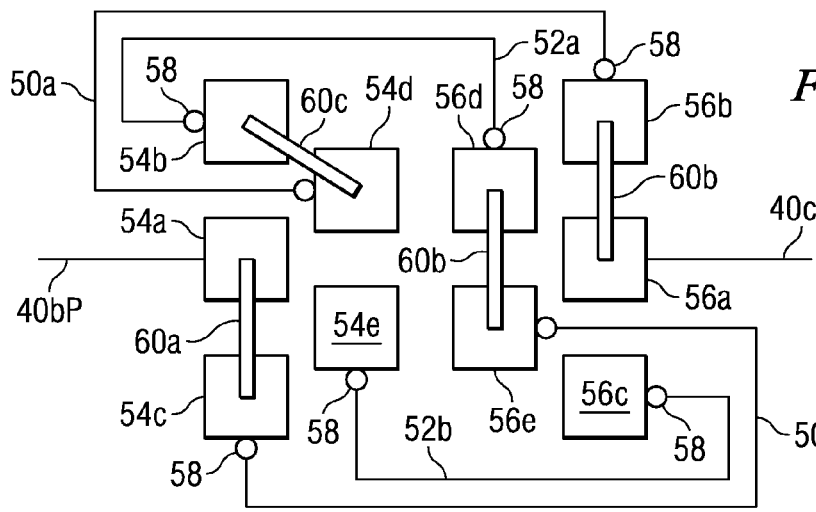
Figure 5G:
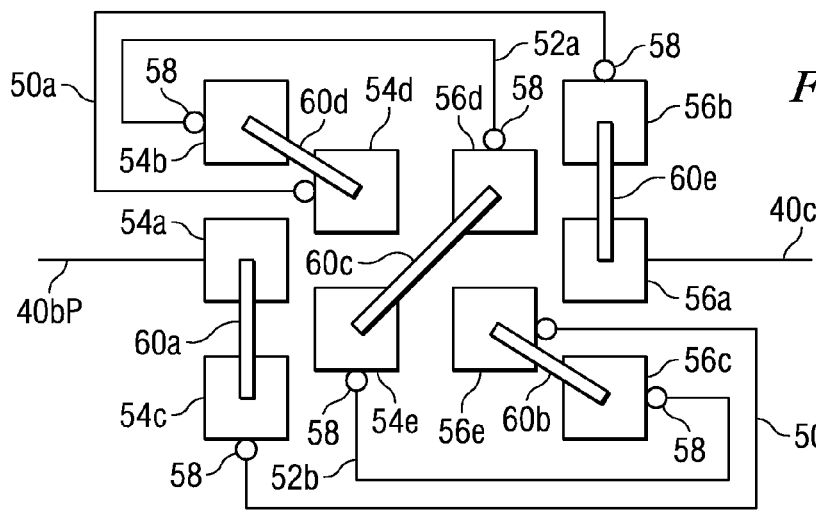

For example, a six inch path length is implemented via trace 50a as shown in FIG. 5c, with zero-ohm conductor 60a connected between pads 54a and 54d, and zero-ohm conductor 60b connected between pads 56b and 56a. FIG. 5d illustrates a nine-inch path length implemented by traces 50a and 52a, with zero-ohm conductor 60a connected between pads 54a and 54d, zero-ohm conductor 60b connected between pads 56d and 54d, and zero-ohm conductor 60c connected between pads 56b and 56a. FIG. 5e illustrates a twelve-inch path length involving traces 50a and 50b, implemented by zero-ohm conductor 60a connected between pads 54a and 54c, zero-ohm conductor 60b connected between pads 56e and 54d, and zero-ohm conductor 60c connected between pads 56b and 56a. A fifteen-inch path length involving traces 52a, 50b, and 50a (in that order) is shown in FIG. 5f as implemented by zero-ohm conductor 60a connected between pads 54a and 54c, zero-ohm conductor 60b connected between pads 56e and 56d, zero-ohm conductor 60c connected between pads 54b and 54d, and zero-ohm conductor 60d connected between pads 56b and 56a. Finally, a maximum-length eighteen-inch path length is implemented by all four traces 50a, 50b, 52a, 52b, as shown in FIG. 5g, by zero-ohm conductor 60a connected between pads 54a and 54c, zero-ohm conductor 60b connected between pads 56e and 56c, zero-ohm conductor 60c connected between pads 54e and 56d, zero-ohm conductor 60d connected between pads 54b and 54d, and zero-ohm conductor 60e connected between pads 56b and 56a.

Deterministic jitter injector 28 thus inserts a selected deterministic jitter into the signal communicated over the loopback path along test board 30, by way of a selected path length. For the example of FIGS. 5a through 5g in which the signal frequency is 3.125 Gbps, it is contemplated that the selection of the maximum path length, with 8 mil trace width and using a pseudo-random binary sequence (PRBS) of length $2^7-1$, can add as much as 22 psec of deterministic jitter to the differential signal. This provides the ability of the test engineer to implement the desired deterministic jitter suitable for the desired test conditions.

According to the preferred embodiment of the invention, therefore, attenuator 26 and deterministic jitter injector 28 can be defined so that the loopback signal from and to SerDes device 10 under test is modified as desired. Preferably, the modification of the signal is established so that the receiver sensitivity and receiver jitter tolerance of serial-to-parallel converter 10sp in SerDes device 10 can be tested, at full speed, and with the desired data pattern. This enables efficient and accurate "Go/No-Go" testing of the important parameters of receiver sensitivity and receiver jitter tolerance for transceiver devices.

According to the preferred embodiment of the invention, as shown in FIGS. 3 and 4, attenuator 26 and deterministic jitter injector 28 are connected in series with one another in the loopback path, with attenuator 26 disposed ahead of deterministic jitter injector 28. Alternatively, deterministic jitter injector 28 may be disposed ahead of attenuator 26. It is possible that the deterministic jitter and attenuation inserted into the signal by attenuator 26 and deterministic jitter injector 28 may be dependent on one another, however, so that the path lengths and component values of attenuator 26 and deterministic jitter injector 28 may depend upon their order of connection in the loopback path.

Referring back to FIG. 4, test board 30 according to the preferred embodiment of the invention also provides additional functionality in the automated test of SerDes device 10. As well known in the art, not only are integrated circuit devices tested for functionality and performance, but these devices also must be tested for various DC parameters. An example of such parametric testing includes input and output leakage of the external device terminals. Test board 30 includes terminals to which ATE drivers and receivers 25 can make connection to terminals SERTX, SERRX for this purpose. As shown in FIG. 4, relay 41P connects conductor 40aP and thus terminal SERTXP to test board terminal PARTXP, and relay 41N connects conductor 40aN and thus terminal SERTXN to test board terminal PARTXN. Similarly, relay 43P connects conductor 40bP and thus terminal SERRXP to test board terminal PARRXP, and relay 43N connects conductor 40bN and thus terminal SERRXN to test board terminal PARRXN. Preferably, relays 41, 43 are connected very closely to conductors 40, to minimize the "stub" length between each conductor 40 and its corresponding relay 41, 43, thus minimizing interference effects on the GHz frequency signals communicated along conductors 40 when relays 41, 43 are open. When relays 41, 43 are closed, ATE drivers and receivers 25 can drive their corresponding terminals SERTX, SERRX to selected voltages, and measure the input and output leakage at these terminals. According to this embodiment of the invention, this parametric testing can be performed with minimum effect on the signal integrity of the loopback path during functional testing.

Test board 30 according to this embodiment of the invention also facilitates characterization measurement of the signal as received at terminals SERRX. In this example, as shown in FIG. 4, microstrip conductors CHARP, CHARN are selectably connectable to conductors 40cP, 40cN by installing zero-ohm conductors 39P, 39N, respectively, for making this connection; in this mode, zero-ohm conductors 37P, 37N that connect conductors 40cP, 40cN to terminals SERTXP, SERTXN, respectively, will not be present. Conversely, the loopback configuration for automated test is configured by installing zero-ohm conductors 37P, 37N to connect conductors 40cP, 40cN to terminals SERTXP, SERTXN, respectively; zero-ohm conductors 39P, 39N will not be installed in this configuration. Preferably, the distance between the points at which conductors 40cP, 40cN potentially connect to zero-ohm conductors 37P, 37N and zero-ohm conductors 39P, 39N is kept very short, to avoid forming stubs and thus to minimize interference at high frequencies. In this manner, test board 30 readily permits the characterization of signals transmitted by parallel-to-serial converter 10ps of SerDes device 10 from microstrip conductors CHARP, CHARN, for example by connecting an oscilloscope or logic analyzer to these conductors. This characterization configuration can be used in setting the amount of attenuation to be inserted by attenuator 26 and also the amount of jitter inserted by deterministic jitter injector 28. Once the attenuation and jitter are determined, then zero-ohm conductors 39P, 39N can be removed and zero-ohm conductors 37P, 37N installed, placing test board 30 in the proper configuration for automated testing of SerDes devices 10.

According to the preferred embodiment of the invention, therefore, the automated testing of transceiver devices can be carried out in a way that also tests the important parameters of both receiver sensitivity and also receiver jitter tolerance. This testing is enabled in a relatively low-cost manner, with close attention paid to signal integrity, even at extremely high GHz frequencies. More particularly, the parameters of receiver sensitivity and receiver jitter tolerance can be used in a "Go/No-Go" functional test, even at full serial data rates, efficiently and accurately testing the functionality and performance of the device under specification conditions. In addition, the attenuation and deterministic jitter parameters can be selectably varied to obtain a signal having the desired properties, for example at worst case limits, while still utilizing the convenience of loopback communications and thus reducing the requirements of the automated test equipment. As a result, high frequency transceiver devices can be fully tested, providing confidence that all specifications will be met by those devices that are shipped to, and installed by, the end users.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A system for performing automated testing of a transceiver device, comprising:
   automated test drivers and receivers; and
   a test board, connected to the automated test drivers and receivers, for receiving a transceiver device to be tested, the test board comprising a loopback conductor path comprised of a plurality of conductors including first and second conductors to be connected to serial output terminals of the transceiver device, and third and fourth conductors to be connected to serial input terminals of the transceiver device;
   an attenuator circuit, disposed on the test board and coupled between the first and second conductors and the third and fourth conductors; and
   a deterministic jitter injector, disposed on the test board and coupled between the first and second conductors and the third and fourth conductors, in series with the attenuator circuit.

2. The system of claim 1, wherein the attenuator circuit comprises:
   a programmable attenuator circuit, coupled to the loopback conductor path.

3. The system of claim 2, wherein the programmable attenuator circuit comprises:
   a first programmable attenuator, coupled to the first and third conductors; and
   a second programmable attenuator, coupled to the second and third conductors;
   wherein each of the first and second programmable attenuators also include a control input, for receiving a digital signal responsive to which the attenuation is programmed.

4. The system of claim 1, wherein the attenuator circuit comprises:
   a fixed attenuator circuit, coupled to the loopback conductor path.

5. The system of claim 4, wherein the fixed attenuator circuit comprises:
   a resistor network.

6. The system of claim 1, wherein the attenuator circuit comprises:
   a programmable attenuator circuit;
   a fixed attenuator circuit; and
   circuitry for coupling a selected one of the programmable attenuator circuit and the fixed attenuator circuit to the loopback conductor path.

7. The system of claim 1, wherein the coupling circuitry comprises:
a plurality of capacitors, connected between a conductor in the loopback conductor path and the selected one of the programmable attenuator circuit and the fixed attenuator circuit.

8. The system of claim 1, wherein the deterministic jitter injector comprises:
first and second variable trace length blocks, for a selected inserting conductor trace length into the loopback conductor path.

9. The system of claim 8, wherein the first variable trace length block is connected in series with the attenuator circuit between the first and third conductors;
and wherein the second variable trace length block is connected in series with the attenuator circuit between the second and fourth conductors.

10. The system of claim 9, wherein the loopback conductors coupled to the variable trace length block have a connector pad at an end adjacent to the variable trace length block;
and wherein each of the first and second variable trace length blocks comprise:
a plurality of circuit board traces, at least one of which has a first length and at least one of which has a second length, each trace having connector pads at its ends; and
at least two zero-ohm conductors, each connected in series between the connector pad of the loopback conductors and a selected one or more of the plurality of circuit board traces.

11. The system of claim 10, wherein the test board is a multilayer circuit board;
and wherein the plurality of circuit board traces include at least one trace of the first length formed in a first layer of the multilayer circuit board, and at least one trace of the second length formed in a second layer of the multilayer circuit board.

12. The system of claim 10, further comprising:
a first relay, connected between the first conductor and a first parametric terminal;
a second relay, connected between the second conductor and a second parametric terminal;
a third relay, connected between the third conductor and a third parametric terminal; and
a fourth relay, connected between the fourth conductor and a fourth parametric terminal;
and wherein the automated test drivers and receivers are connected to the first, second, third, and fourth terminals, and are for measuring leakage at serial output terminals and serial input terminals of the transceiver device.

13. The system of claim 1, further comprising:
a control computer, connected to the automated test drivers and receivers.

14. A method of testing a transceiver device, comprising:
placing a transceiver device in connection with a test board, the test board including a loopback conductor path between serial output terminals and serial input terminals of the transceiver device, the loopback conductor path including an attenuator and a deterministic jitter injector coupled in series between the serial output terminals and serial input terminals of the transceiver device;
causing the transceiver device to transmit serial data from its serial output terminals to the loopback conductor path;
comparing serial data received at the serial input terminals to the serial data transmitted from the serial output terminals; and
responsive to the comparing step, determining whether the transceiver device passed or failed the test.

15. The method of claim 14, further comprising:
determining an attenuation level to be included in the loopback conductor path; and
responsive to the determining step, configuring the attenuator on the test board to apply the determined attenuation level in the loopback conductor path.

16. The method of claim 15, wherein the determining step comprises:
connecting a programmable attenuator in the loopback conductor path;
controlling the programmable attenuator to present a plurality of attenuation levels; and
operating the transceiver device for each of the plurality of attenuation levels.

17. The method of claim 16, wherein the configuring step comprises:
disconnecting the programmable attenuator from the loopback conductor path; and
connecting a fixed attenuator, having a selected attenuation level, to the loopback conductor path.

18. The method of claim 14, further comprising:
defining a deterministic jitter level to be included in the loopback conductor path; and
responsive to the determining step, configuring the deterministic jitter injector on the test board to apply the defined deterministic jitter level in the loopback conductor path.

19. The method of claim 18, wherein the configuring step comprises:
connecting one or more of a plurality of trace lengths in the deterministic jitter injector in series in the loopback conductor path.

20. The method of claim 14, wherein the step of causing the transceiver device to transmit serial data comprises:
applying data to parallel inputs of the transceiver device;
and wherein the comparing step comprises:
comparing data presented at parallel outputs of the transceiver device with the data applied in the applying step.

21. The method of claim 14, wherein the step of causing the transceiver device to transmit serial data comprises:
activating a sequence generator circuit in the transceiver device, so that a data sequence generated by the sequence generator circuit is applied at the serial output terminals.

22. The method of claim 14, further comprising:
connecting parametric terminals of the test board to each of the serial output terminals and serial input terminals of the transceiver device; and
testing leakage currents at each of the parametric terminals.

* * * * *